(12) United States Patent
Gunasekar et al.

(10) Patent No.: US 8,369,133 B2
(45) Date of Patent: Feb. 5, 2013

(54) POWER GATEABLE RETENTION STORAGE ELEMENT

(75) Inventors: Aswin K. Gunasekar, Austin, TX (US); Daniel W. Bailey, Austin, TX (US); Aaron S. Rogers, Pflugerville, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 210 days.

(21) Appl. No.: 12/862,131

(22) Filed: Aug. 24, 2010

(65) Prior Publication Data

US 2012/0051121 A1 Mar. 1, 2012

(51) Int. Cl.
*G11C 7/10* (2006.01)
(52) U.S. Cl. .................................. 365/154; 365/189.05
(58) Field of Classification Search .................. 365/154, 365/189.05
See application file for complete search history.

(56) References Cited

U.S. PATENT DOCUMENTS 7,710,765 B2 * 5/2010 Hanafi ........................... 365/156

* cited by examiner

*Primary Examiner* — Son Dinh
*Assistant Examiner* — Nam Nguyen
(74) *Attorney, Agent, or Firm* — Williams, Morgan & Amerson, P.C.

(57) ABSTRACT

A method, electronic device, and system are provided in which data is stored in a gateable retention storage element. Also provided is a computer readable storage device encoded with data for adapting a manufacturing facility to create an apparatus which includes a silicon chip. The method includes storing a data value in a storage element, wherein the storage element is at least one of a flip-flop, a latch or a register. The method also includes placing the storage element in a low power state comprising removing one or more existing connections between the actual ground node and at least one other component in the storage element. The method also includes maintaining the data value in the storage element subsequent to placing the storage element into the low power state. The electronic device includes a storage component for storing a data value. The electronic device also includes a pair of cross-coupled inverter components communicatively coupled to the storage component, the pair of cross-coupled inverter components being adapted to maintain the data value stored by the storage component subsequent to placing the storage component into a low power state and being adapted to maintain a connection with an actual ground node subsequent to placing the storage component into the low power state. The system includes an array of storage elements adapted to store data.

29 Claims, 9 Drawing Sheets

830

Switch to Low Power State

Maintain Real Ground Connection to Cross-Coupled Inverters — 910

Disconnect Real Ground Connection to Other Components — 920

Connect Other Components to False Ground Connection — 930

840

Maintain Stored Data Value in Low Power State

FIGURE 9

POWER GATEABLE RETENTION STORAGE ELEMENT

BACKGROUND

1. Field of the Invention

Embodiments of this invention relate generally to computers, and, more particularly, to a method and apparatus for a power gateable retention storage element.

2. Description of Related Art

Computer circuitry has evolved from relatively simple, basic implementations to complex, high-speed designs. An increase in speed, features and capabilities of modern communications, computing and processing devices has driven computer circuitry to consume more power in many areas. Such power-intensive circuit designs have been a challenge for designers and a problem for consumers, for example, in mobile devices where battery life may be negatively affected by such power-intensive circuit designs. Similarly, products like desktop and laptop computers, computer monitors and the like have increased in size, complexity and speed. Devices with sleep, low-power and/or standby modes (hereinafter, low-power mode) have attempted to ameliorate battery life and power consumption issues by allowing such devices to consume less power when not in use by users.

Typically, at a computer circuit level, modern communications, computing and processing devices are based upon standard building blocks such as latches, flip-flops, combinatorial logic, buffers and inverters, transistors and the like. Storage elements like latches and flip-flops hold values when they are powered on, but lack the ability to maintain stored values when powered off. Current circuit implementations attempt to reduce this problem by off-loading stored values into "shadow latches" or "shadow registers" while a device is in a low-power mode. These implementations allow the latches and flip-flops to be powered down but have drawbacks. For example, off-loading stored values to shadow latches increases the size of the circuit footprint because a shadow latch must be included in addition to each regular storage element. Increased footprint size/complexity may have a negative effect on circuit routing as well. Additionally, shadow latches also consume power in order to maintain any stored values. Another drawback of using shadow latches is that when a device comes out of its low-power mode, the values stored in the shadow latches must be reloaded into the regular latches and flip-flops before the pre-power down state can be realized. This reloading requires time, and thus power, as well as the circuitry necessary to control the reloading.

SUMMARY OF EMBODIMENTS OF THE INVENTION

In one aspect of the present invention, a method is provided. The method includes storing a data value in a storage element, wherein the storage element is at least one of a flip-flop, a latch or a register. The method also includes placing the storage element in a low power state comprising removing one or more existing connections between the actual ground node and at least one other component in the storage element. The method also includes maintaining the data value in the storage element subsequent to placing the storage element into the low power state.

In another aspect of the present invention, an electronic device is provided. The electronic device includes a storage component for storing a data value. The electronic device also includes a pair of cross-coupled inverter components communicatively coupled to the storage component, the pair of cross-coupled inverter components being adapted to maintain the data value stored by the storage component subsequent to placing the storage component into a low power state and being adapted to maintain a connection with an actual ground node subsequent to placing the storage component into the low power state.

In yet another aspect of the present invention, a computer readable storage device encoded with data that, when implemented in a manufacturing facility, adapts the manufacturing facility to create an apparatus, is provided. The apparatus includes a silicon chip. The silicon chip includes at least one storage element. Each storage element includes a storage component for storing a data value and a pair of cross-coupled inverter components communicatively coupled to the storage component, where the pair of cross-coupled inverter components are adapted to maintain the data value stored by the storage component subsequent to placing the storage component into the low power state. The storage element also includes a false ground node communicatively coupled to the at least one storage element and an actual ground node communicatively coupled to the at least one storage element. The storage element also includes at least one switching component communicatively coupled the false ground node and the actual ground node, where each switching component is adapted to receive a signal indicative of a change to a low power state and is adapted to place the at least one storage elements in a low power state substantially immediately after receiving the signal indicative of a change to a low power state.

In yet another aspect of the present invention, a system is provided. The system includes an array of storage elements, where each storage element of the array of storage elements is adapted to store a data value. The system provides that each storage element includes one or more storage components adapted to store a data value and one or more pairs of cross-coupled inverter components communicatively coupled to the storage components. The cross-coupled inverter components are adapted to maintain the data value stored by the storage components subsequent to placing the array of storage elements into a low power state. Each inverter component is also adapted to drive the other inverter component. Each storage element also includes one or more output nodes respectfully communicatively coupled to at least one or more storage components. The system further includes a false ground node communicatively coupled to the array of storage elements and an actual ground node communicatively coupled to the array of storage elements.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIG. 9 illustrates an exemplary, detailed low power state, data storage operation flowchart with respect to the switch to a low power state (as shown in FIG. 8), according to one exemplary embodiment.

Figure 1:
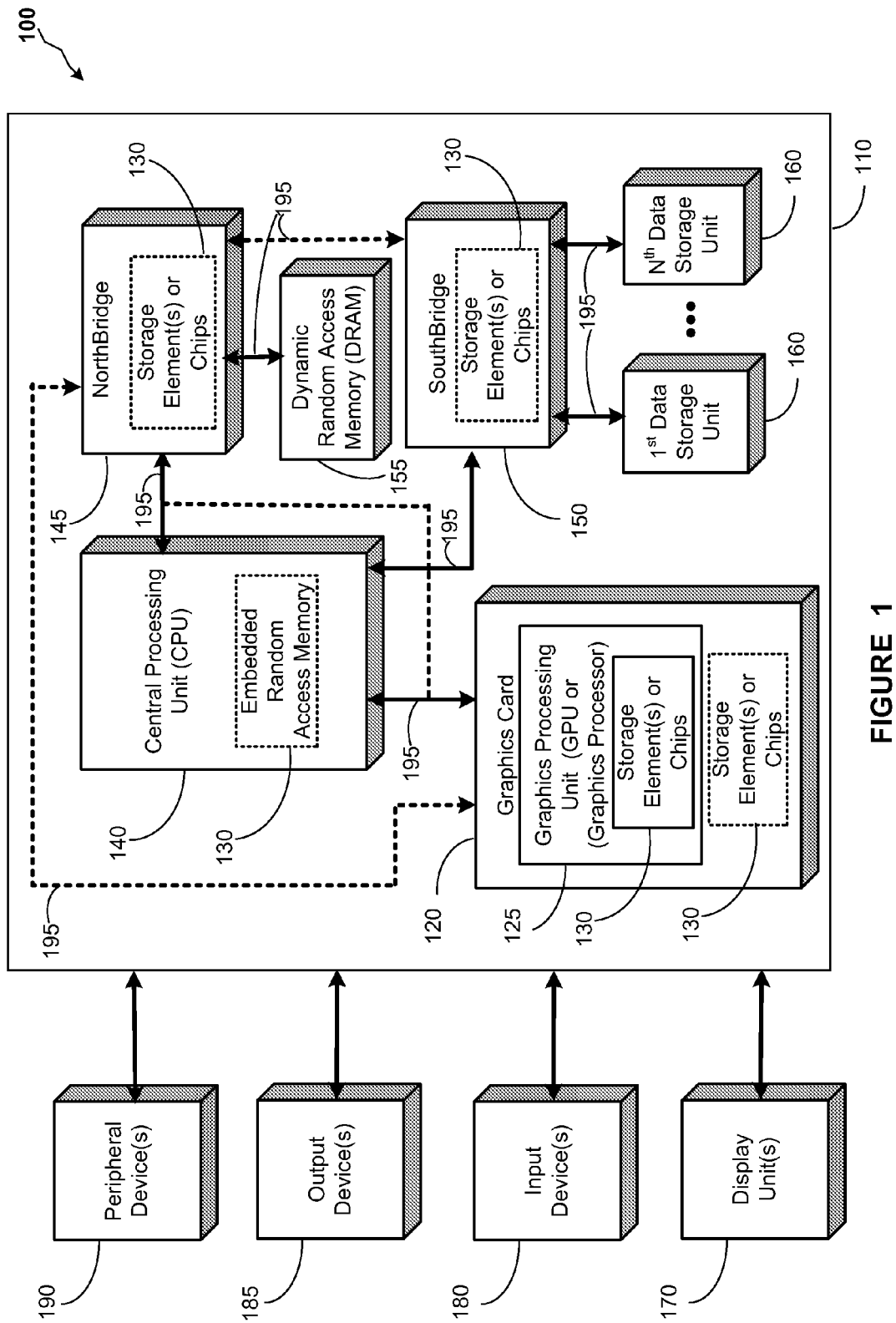
FIG. 1 schematically illustrates a simplified block diagram of a computer system including a graphics card that employs a storage scheme according to one exemplary embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

The present invention will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The term "substantially immediately," as used in the instant Application and claims with respect to a storage element coming out of a low-power/stand by state, is intended to mean a period of time within ±90% of the C3 power state recovery time, as described in U.S. P.G. Pub. 2010/0058078, Protocol for Power State Determination and Demotion (Alexander Branover, et al), incorporated herein by reference.

The use of any size complementary metal-oxide semiconductor (CMOS) implementation and technology is contemplated for carrying out various embodiments described herein. Additionally, non-CMOS implementations are also contemplated.

The term "standard storage element" refers to storage elements as commonly used in the art not having the added benefits and features described in the various embodiments of the present invention. For example, as noted in the Background above, current implementations of low-power designs may use a "standard" flip-flop and a shadow latch. As shown under one or more embodiments herein, a shadow latch is not necessary for implementing a low-power mode. Under one or more embodiments herein, low power may be implemented in a flip-flop sized the same as, or substantially the same as, a "standard storage element" (e.g., a "standard" flip-flop). "Substantially the same as" as used immediately above, refers to a size or footprint within about 10 percent of a "standard" size.

The term "storage element," as used herein, means a single flip-flop, a single latch, a single register, or similar data storage device, as would be understood by one of ordinary skill in the art having the benefit of this disclosure. A "storage element," as used herein, does not include an accompanying shadow latch as would a "standard storage element" (discussed above); rather, a "storage element," according to various embodiments, may maintain storage of a data value on its own when in a low-power state, without the need for a shadow latch or other secondary storage devices. "Storage elements" may also encompass groups or arrays of the single flip-flops, single latches, single registers, or other above mentioned examples.

The term "electronic device" may include storage elements specifically in addition to desktop and laptop computers, servers and computing devices, electronic components (e.g., storage drives/hard drives, memory, field programmable gate arrays (FPGAs), application specific integrated circuits (ASICs), programmable logic arrays and programmable array logics (PLAs/PALs), complex programmable logic devices (CPLDs), microprocessors, microcontrollers, floppy drives, tape drives, compact disc and digital video disc (CD-ROM and DVD) drives, and the like, computer monitor devices, printers and scanners, processing devices, wireless devices, personal digital assistants (PDAs), mobile phones, portable music players, video games and video game consoles, external memory devices (e.g., Universal Serial Bus (USB) thumb drives, external hard drives, and the like), audio and video players, stereos, televisions, manufacturing equipment, automobiles and motorcycles, electrical systems in mass-transit vehicles (e.g., buses, trains, airplanes, and the like), security systems and any other device or system employing storage elements. Additionally, an "electronic device" may be an apparatus employing elements of a "storage element," as discussed above. An "electronic device" may include one or more "storage elements," one or more arrays of "storage elements," and/or one or more silicon chips.

It is contemplated that different embodiments described herein may be implemented together in various combinations, as would be apparent to one of skill in the art having the benefit of this disclosure. That is, embodiments depicted herein are not mutually exclusive of each other and may be practiced alone, or in any combination, in accordance with the descriptions herein.

Embodiments of the present invention generally provide for power gateable retention storage elements capable of maintaining data in low power states to be used in different computing and processing devices.

Turning now to FIG. 1, a block diagram of an exemplary computer system 100, in accordance with an embodiment of the present invention, is illustrated. In various embodiments, the computer system 100 may be a personal computer, a laptop computer, a handheld computer, a mobile device, a telephone, a personal data assistant (PDA), a server, a mainframe, a work terminal, or the like. The computer system 100 includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be an ATI Radeon™ graphics card from Advanced Micro Devices ("AMD") or any other graphics card using memory, in alternate embodiments. The graphics card 120 may, in different embodiments, be connected on a Peripheral Component Interconnect (PCI) Bus (not shown), PCI-Express Bus (not shown) an Accelerated Graphics Port (AGP) Bus (also not shown), or any other connection known in the art. It should be noted that embodiments of the present invention are not limited by the connectivity of the graphics card 120 to the main computer structure 110. In one embodiment, the computer system 100 runs an operating system such as Linux, UNIX, Windows, Mac OS, or the like.

In one embodiment, the graphics card 120 may contain a graphics processing unit (GPU) 125 used in processing graphics data. The GPU 125, in one embodiment, may include an embedded memory 130. In one embodiment, the embedded memory 130 may be an embedded random access memory (RAM), an embedded static random access memory (SRAM), or an embedded dynamic random access memory (DRAM). In alternate embodiments, the embedded memory 130 may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes a central processing unit (CPU) 140, which is connected to a northbridge 145. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, the CPU 140, the northbridge 145, and the GPU 125 may be included in a single package or as part of a single die or "chips." Alternative embodiments, which alter the arrangement of various components illustrated as forming part of main structure 110, are also contemplated. The CPU 140 and/or the northbridge 145, in certain embodiments, may each include an embedded memory 130 in addition to other embedded memories 130 found elsewhere in the computer system 100. In certain embodiments, the northbridge 145 may be coupled to a system RAM (or DRAM) 155; in other embodiments, the system RAM 155 may be coupled directly to the CPU 140. The system RAM 155 may be of any type of RAM known in the art. The type of RAM 155 does not limit the embodiments of the present invention. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have an embedded memory 130, in addition to any other embedded memories 130 elsewhere in the computer system 100. In various embodiments, the southbridge 150 may be connected to one or more data storage units 160. The data storage units 160 may be hard drives, solid state drives, magnetic tape, or any other writable media used for storing data. In various embodiments, the central processing unit 140, northbridge 145, southbridge 150, graphics processing unit 125, DRAM 155 and/or embedded RAM 130 may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present invention. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to physical digital media, a USB device, Zip Drive, external floppy drive, external hard drive, phone and/or broadband modem, router/gateway, access point and/or the like. To the extent certain exemplary aspects of the computer system 100 are not described herein, such exemplary aspects may or may not be included in various embodiments without limiting the spirit and scope of the embodiments of the present invention as would be understood by one of skill in the art.

Figure 2:
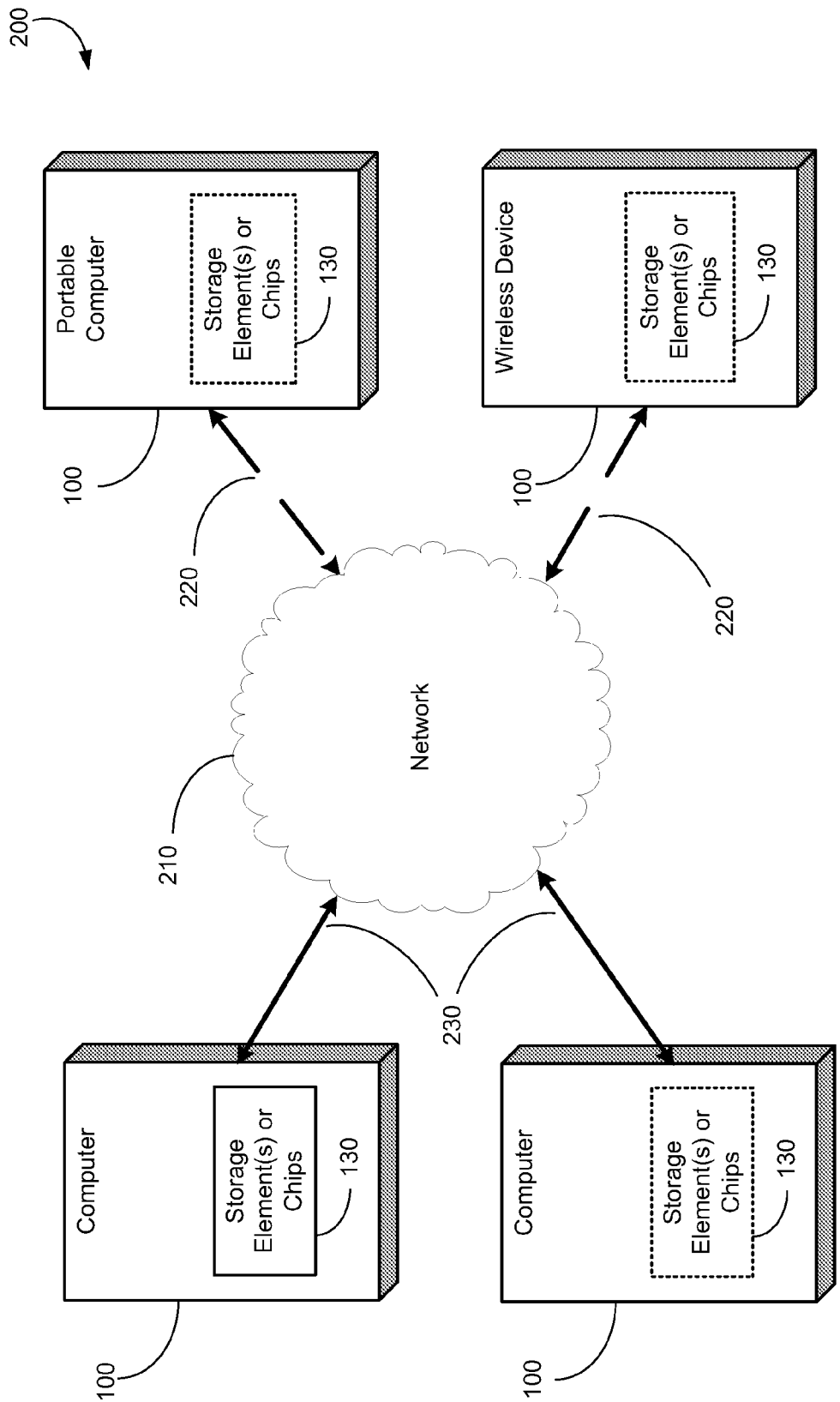
FIG. 2 shows a simplified block diagram of a multiple computer system connected via a network according to one exemplary embodiment.

Turning now to FIG. 2, a block diagram of an exemplary computer network 200, in accordance with an embodiment of the present invention, is illustrated. In one embodiment, any number of computer systems 100 may be communicatively coupled and/or connected to each other through a network infrastructure 210. In various embodiments, such connections may be wired 230 or wireless 220 without limiting the scope of the embodiments described herein. The network 200 may be a local area network (LAN), wide area network (WAN), personal network, company intranet or company network, the Internet, or the like. In one embodiment, the computer systems 100 connected to the network 200 via network infrastructure 210 may be a personal computer, a laptop computer, a handheld computer, a mobile device, a telephone, a personal data assistant (PDA), a server, a mainframe, a work terminal, or the like. The number of computers depicted in FIG. 2 is exemplary in nature; in practice any number of computer systems 100 maybe coupled/connected using the network 200.

Figure 3:
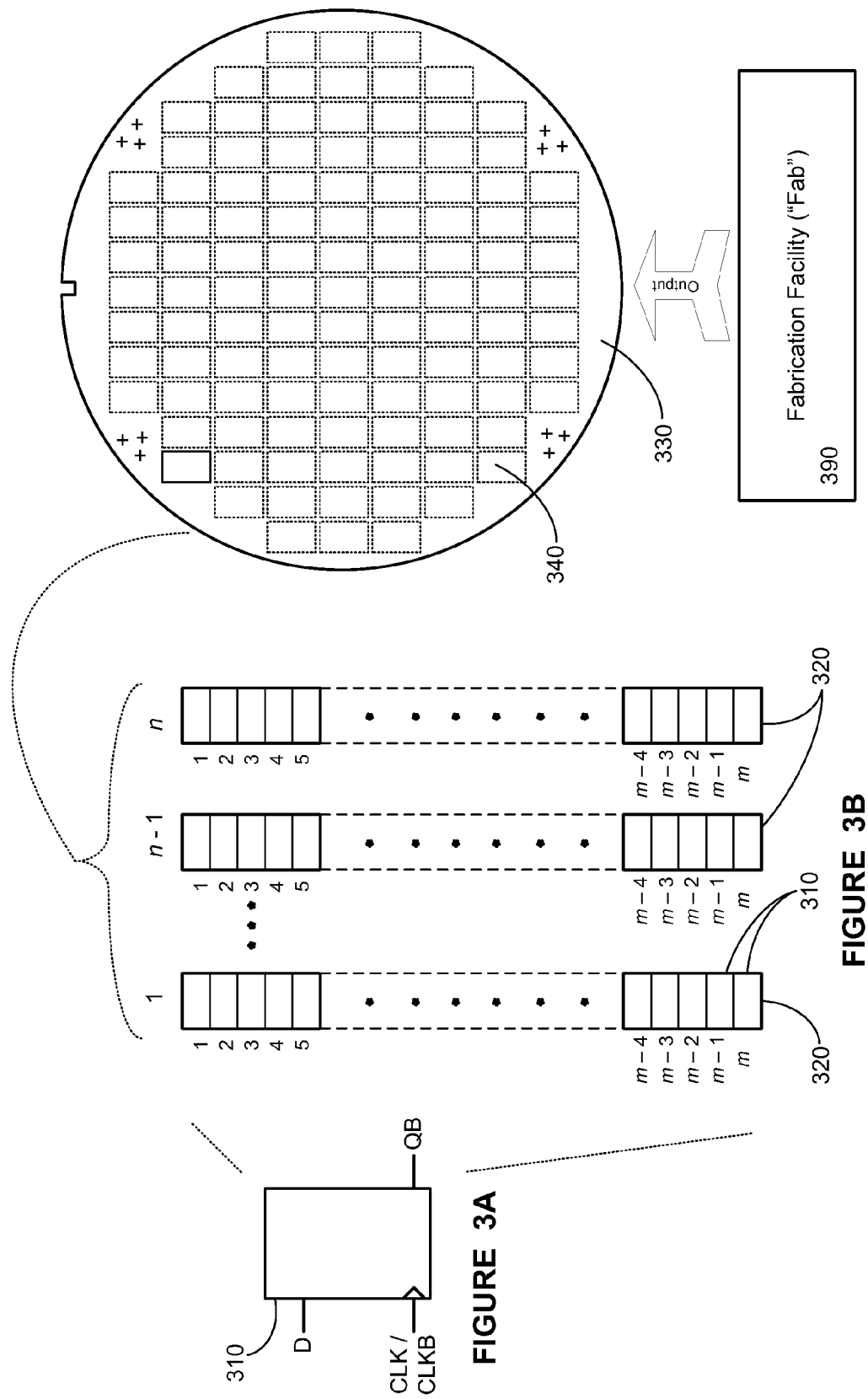
FIGS. 3A-3B illustrate a simplified, exemplary representation of a storage element, and an array of storage elements, which may be used in silicon chips, as well as devices depicted in FIGS. 1 and 2, according to one exemplary embodiment.
FIG. 3C illustrates a simplified, exemplary representation of a semiconductor fabrication facility used to produce a semiconductor wafer or product, according to one exemplary embodiment.

Turning now to FIG. 3A, a simplified, exemplary representation of a storage element 310, and array 320 of storage elements 310, which may be used in silicon chips 340, as well as devices depicted in FIGS. 1 and 2, according to one embodiment is illustrated. FIG. 3 depicts an exemplary storage element 310 (here a QB, non-scan, D flip-flop), in accordance with one embodiment. The storage element 310 may be any kind of storage element, including those previously described above. The storage elements 310 may be implemented as single elements (310) or in arrays 320 or in other groups (not shown).

Turning to FIG. 3B, an array 320 of storage elements 310 may be comprised of n columns where each column consists of m rows. In other words, a grouping of storage elements 310 may be implemented in an array 320 of "m×n" storage elements 310. It is contemplated that both m and n may be an integer greater than or equal to 1. For example, according to two specific embodiments, the array 320 may consist of a single storage element 310 (a 1×1 array, where m=1 and n=1) or may consist of 65,536 storage elements 310 (a 256×256 array, where m=256 and n=256) or consist of 256 storage elements 310 (a 256×1 array, where m=256 and n=1), or any other configuration as would be apparent to one of skill in the art having the benefit of this disclosure. The arrays 320 of storage elements 310 may be used in central and graphics processors, motherboards, graphics cards, combinatorial logic implementations, register banks, memory, other integrated circuits (ICs), or the like.

In one embodiment, as shown in FIG. 3C, one or more arrays 320 of storage elements 310 may be included on a silicon chip 340 (or computer chip). A silicon chip 340 may contain one or more different configurations of arrays 320 of storage elements 310. The silicon chips 340 may be produced on a silicon wafer 330 in a fabrication facility (or "fab") 390. That is, the silicon wafers 330 and silicon chips 340 may be referred to as the output, or product of, the fab 390. The silicon chips 340 may be used in electronic devices, such as those described above in this disclosure.

Figure 4:
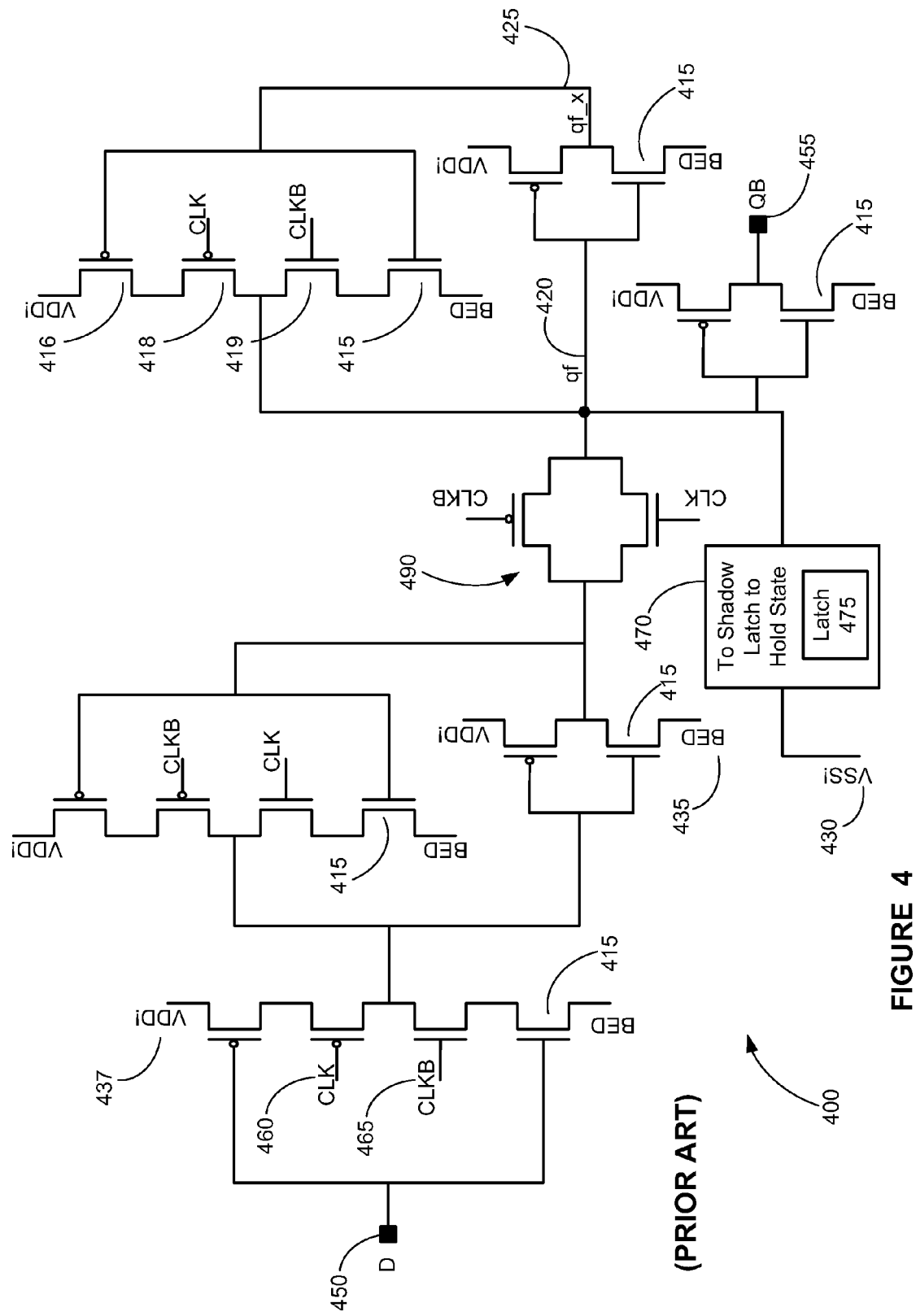
FIG. 4 illustrates detailed representation of a standard prior art storage element utilizing a shadow latch, according to one exemplary embodiment.

Turning now to FIG. 4, a detailed representation of a standard prior art storage element 400 utilizing a shadow latch is depicted. The prior art storage element 400 is depicted as a configuration of metal oxide semiconductor field effect transistors (MOSFETs) communicatively coupled to a shadow latch connection 470. The MOSFETs depicted are shown as n-type (nFET) and p-type (pFET) MOSFETs, as would be apparent to one of skill in the art having the benefit of this disclosure. The prior art storage element 400 includes a power node (VDD!) 437 (as called a "non-ground potential node" herein) and a false ground node (BED) 435. The node VDD! 437 is connected to various components of the prior art storage element 400 via pFETs 416, and a false ground node BED 435 is connected to various components of the prior art storage element 400 via nFETs 415. The prior art storage element 400 includes a connection to an actual ground node (VSS!) 430 via a power gating component 700, described in further detail below in FIGS. 7A-7B and accompanying descriptions. The prior art storage element 400 includes an input 450 ("D") and an inverted output 455 ("QB"). The value provided at input 450 is clocked in using clocking signals CLK 460 and CLKB 465 as well as clocking component 490. Clocking signals CLK 460 and CLKB 465 are presented to clocking gates of the pFETs and nFETs as shown in FIG. 4. Once clocked in, the input value is stored at a storage node 420 ("qf"). A corresponding inverted input value is stored in a storage node 425 ("qf_x"). An inverted storage value, corresponding to the value stored at storage node 420, is presented at output 455. Additionally, the value stored at storage node 420 is also presented to a shadow latch 470 (or shadow register) via shadow latch connection 470. The shadow latch connection 470 includes a shadow latch 475 that stores the value in storage node 420. As such, the shadow latch 475 holds the state of the prior art storage element 400.

Referring still to FIG. 4, when the prior art storage element 400 is placed in a low power mode/state or sleep mode (via a power gating component 700, (shown and discussed in further detail below with respect to FIGS. 7A-7B), all nFETs 415 are disconnected from actual ground VSS! 430 and are then connected to the false ground BED 435. The false ground node BED 435 may also be referred to as a floating ground node. The false ground node BED 435 is not an actual ground node, thus when many of the circuit elements shown in prior art storage element 400 no longer have a connection from node VDD! 437 to VSS! 430 (i.e., a path from power to ground), the amount of current used by prior art storage element 400 is reduced. Because the amount of current is minimized in the low power state, less power is dissipated by components of the prior art storage element 400. Thus, when the circuit is connect to the false ground node BED 435 instead of VSS! 430, the prior art storage element 400 is in a low-power state. When the prior art storage element 400 is in the low-power state, a data value cannot be stored in a storage node 420 (or a node 425) because the storage components of the prior art storage element 400 do not have power. To compensate, the shadow latch connection 470 stores the value in the shadow latch 475. The shadow latch 475 maintains a connection to the power node VDD! and to the actual ground node VSS! That is, the shadow latch 475 does not move into a low-power state, but must stay operative and powered when the prior art storage element 400 is in a low-power state in order to maintain the stored value from the storage node 420. The shadow latch connection 470 and shadow latch 475 also require additional routing and physical space in the circuit, which adds to routing and layout complexity and thus causes inefficiencies with respect to physical design considerations.

Figure 5:
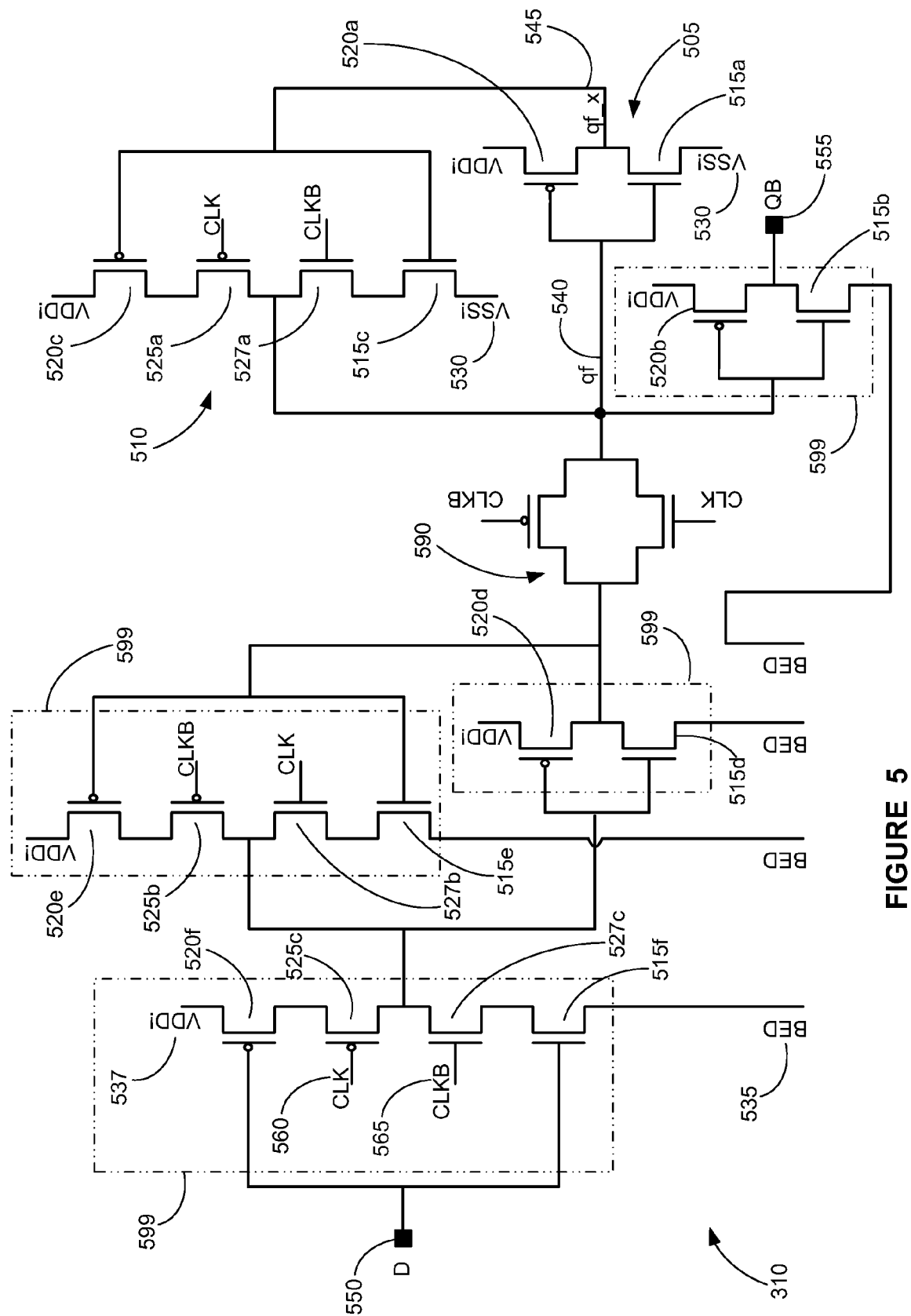
FIG. 5 illustrates a detailed representation of a power gateable retention storage element, according to one exemplary embodiment.

Turning now to FIG. 5, a detailed and exemplary power gateable retention storage element 310, in accordance with one or more embodiments, is depicted. The storage element 310 is depicted as a configuration of n-type (nFET) and p-type (pFET) MOSFETs, as would be apparent to one of skill in the art having the benefit of this disclosure. The storage element 310 includes a power node (VDD!) 537 (also called a "non-ground potential node" herein) and a false ground node (BED) 535. The power node VDD! 537 is connected to various components of the storage element 310 via pFETs 520a-520f, and the false ground node BED 535 is connected to various components of the storage element 310 via nFETs 515b-515f. The storage element 310 includes a connection to an actual ground node (VSS!) 530 via nFET 515a and a power gating component 700 (shown and described in further detail below in FIGS. 7A-7B). The storage element 310 includes an input terminal 550 ("D") and an inverted output terminal 555 ("QB"). Clocking signals CLK 560 and CLKB 565 as well as a clocking component 590 are used to controllably pass any value presented at the input terminal 550. The clocking signals CLK 560 is presented to clocking gates of pFETs 525a, 525c and nFET 527b, and CLKB 565 is presented to clocking gates of pFET 525b and nFETs 527a, 527c. Once clocked in, the input value presented at the input terminal 550 is stored at storage node 540 ("qf"). A corresponding inverted input value is stored in node 545 ("qf_x"). As shown in FIG. 5, storage nodes 540 and 545 may also be referred to as "storage components," in one or more embodiments. An inverted storage value, corresponding to the value stored at storage node 540, is presented at the inverted output terminal 555.

Figure 6:
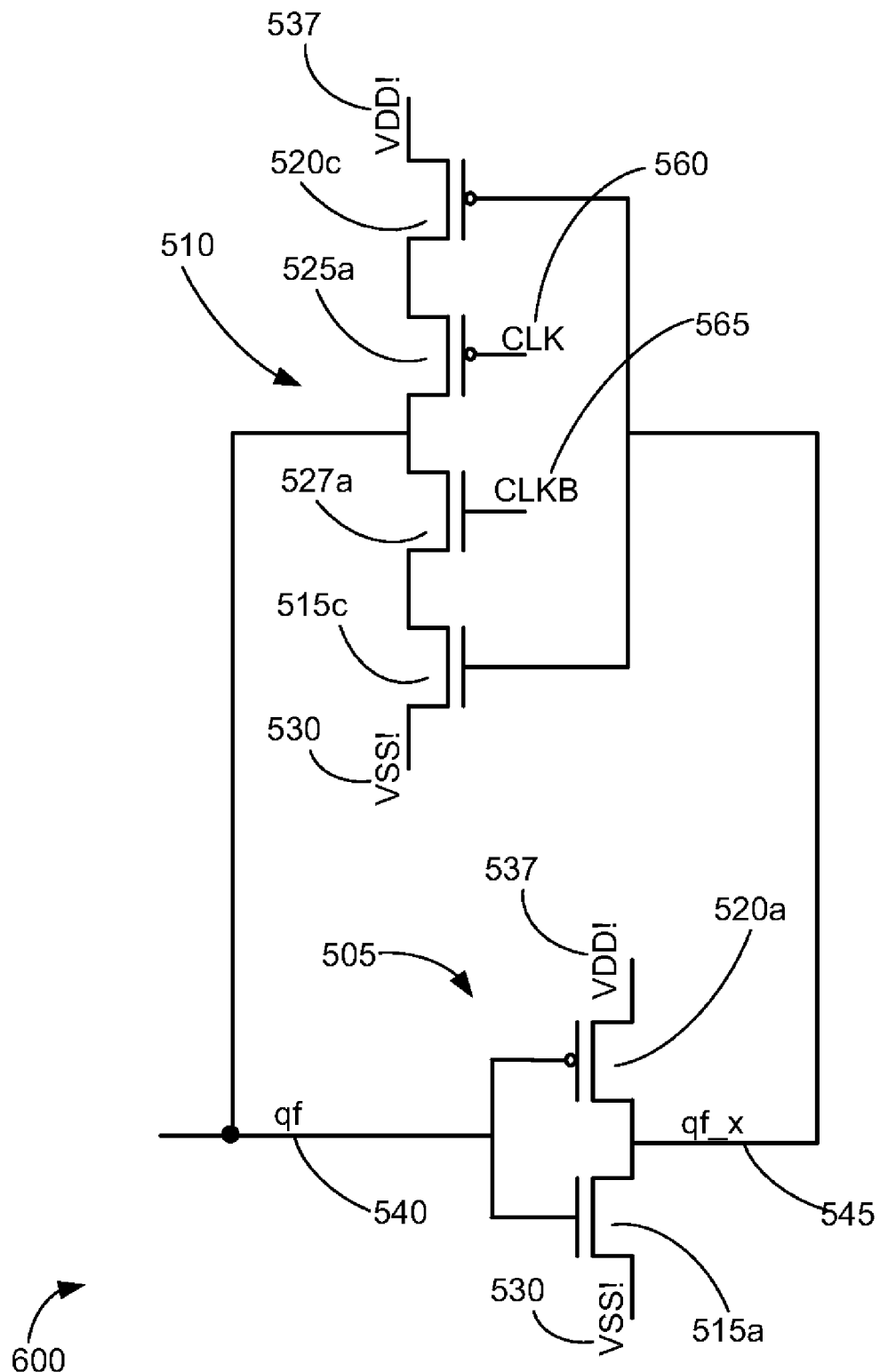
FIG. 6 illustrates a detailed representation of a pair of cross-coupled inverters in the power gateable retention storage element of FIG. 5, according to one exemplary embodiment.

Referring now to FIGS. 5 and 6, in one or more embodiments, the storage element 310 includes a pair of cross-coupled inverters 600 (inverter 505 and inverter 510). In an exemplary embodiment, as shown in FIG. 5, inverter 505 includes the nFET 515a connected to actual ground node VSS! 530 and to the pFET 520a, the pFET 520a also being connected to the power node VDD! 537. In one embodiment, the gates of the inverter 505 are connected to the storage node 540 (storage component 540), and the storage node 545 is connected to the drain of the nFET 515a and the drain of the pFET 520a, as shown in FIG. 5. In an exemplary embodiment, the inverter 510 includes the nFET 515c connected to the actual ground node VSS! 530 and to the nFET 527a that has its gate coupled to CLKB 565. The nFET 527a may be connected to the pFET 525a that has its gate coupled to CLK 560. The pFET 525a may in turn be connected to the pFET 520c (the pFET 520c also being connected to the power node VDD! 537). In one embodiment, the gates of the nFET 515c and the pFET 520c of inverter 510 are connected to the storage node 545 (storage component 545), and the storage node 540 is connected to the drain of the nFET 527a and the drain of the pFET 525a as shown in FIG. 5. Such a configuration may allow the pair of cross-coupled inverters 600 to drive each other.

Still referring to FIGS. 5 and 6, in one embodiment, the storage element 310 may be placed into a low power state using a power gating component 700, described in further detail below in FIGS. 7A-7B and accompanying descriptions. Additionally, it is contemplated that other gating and/or switching implementations may be used in addition to, or alternately of, those explicitly described herein; such additional or alternative implementations would be apparent to one of skill in the art having the benefit of this disclosure. In one embodiment, storage element 310 may also include one or more other components 599 in addition to the pair of cross-coupled inverters 600, the storage component/node 540 and the clocking component 590. The other components 599 may also be referred to as additional components 599. The other components 599 may be input components, output components, inverter components, buffer components or the like. When storage element 310 is placed in a low power mode/state or sleep mode (for example, using power gating component 700, described in further detail below in FIGS. 7A-7B and accompanying descriptions), the nFETs 515b, 515d-515f of the other components 599 are disconnected from actual ground node VSS! 530 and are then connected to the false ground node BED 535. Because the false ground node BED 535 is not an actual ground node, the circuits of the other components 599 shown in the storage element 310 no longer have a connection from power node VDD! 537 to actual ground node VSS! 530 (i.e., no path from power to ground). Because no path exists, very little, if any, power may be dissipated by the other components 599 of the storage element 310. The nFETs 515a, 515c of the inverters 505 and 510, in accordance with one or more embodiments, are not switched from the power node VSS! 530 to the false ground node BED 535 subsequent to the storage element 310 going into a low power state. The nFETs 515a, 515c of the inverters 505 and 510, in accordance with one or more embodiments, may stay connected to the actual ground node VSS! 530 during a low power state, and thus maintain power and may maintain a stored value in the storage node 540.

The placement of source connections for the nFETs 515a, 515c of the inverters 505 and 510, in accordance with one or more embodiments, should be placed closer to the actual ground node VSS! 530 and/or further from the false ground node BED 535 than the source connections for the nFETs 515b, 515d-515f of the other components 599. Such placement may require new, unique and/or sophisticated placement and routing techniques. In one embodiment, this configuration may allow the low power configuration described above to maintain a data value in the storage node/component 540 during the low power state. In one or more embodiments, the storage element 310 may enter a low power state substantially immediately after receiving a signal indicative of a change to the low power state while maintaining the a data value in the storage node/component 540. Additionally, the storage element 310 may return from a low power state to an operating state substantially immediately after receiving a signal indicative of a change from the low power state to an operating state (while maintaining the a data value in the storage node/component 540). In one embodiment, the storage element 310 may provide the data value in the storage node/component 540 to the inverted output terminal 555 substantially immediately after returning from the low power state to the operating state. As such, in various embodiments, the storage element 310 may be able to save power in an electronic device (e.g., a mobile telephone or laptop or the like) by quickly changing to a low power state and only keeping the pair cross-coupled inverters 600 (shown in FIG. 6 and discussed in further detail below) powered and operational. Additionally, the storage element 310 may allow an electronic device to more quickly return to a state wherein a user may utilize the electronic device (e.g., returning to a user state in a time substantially equal to a C3 power state recovery time). The storage element 310 may also use less area in a silicon chip 340 by not requiring the shadow latch 475 to store a data value while in low power mode. In one embodiment, this may also facilitate placement and routing (and/or overall physical design efficiency).

Turning now to FIG. 6, a detailed representation of the pair of cross-coupled inverters 600 in the power gateable retention storage element 310 of FIG. 5, according to one exemplary embodiment, is depicted. In an exemplary embodiment, as shown in FIG. 6, inverter 505 includes the nFET 515a connected to the actual ground node VSS! 530 and to the pFET 520a, the pFET 520a also being connected to the power node VDD! 537. In one embodiment, the gates of inverter 505 are connected to the storage node 540 (storage component 540), and the storage node 545 is connected to the drain of the nFET 515a and the drain of pFET 520a as shown in FIG. 5. In an exemplary embodiment, the inverter 510 includes the nFET 515c connected to the actual ground node VSS! 530 and to the nFET 527a. The nFET 527a may have its gate connected to CLKB 565. The nFET 527a may be connected to the pFET 525a that has its gate connected to CLK 560. The pFET 525a may in turn be connected to a pFET 520c (the pFET 520c being connected to the power node VDD! 537). In one embodiment, the gates of the nFET 515c and the pFET 520c in inverter 510 are connected to the storage node 545 (storage component 545), and the storage node 540 is connected to the drain of the nFET 527a and the drain of the pFET 525a as shown in FIGS. 5 and 6. Such a configuration may allow the pair of the cross-coupled inverters 600 to drive each other.

Figure 7A:
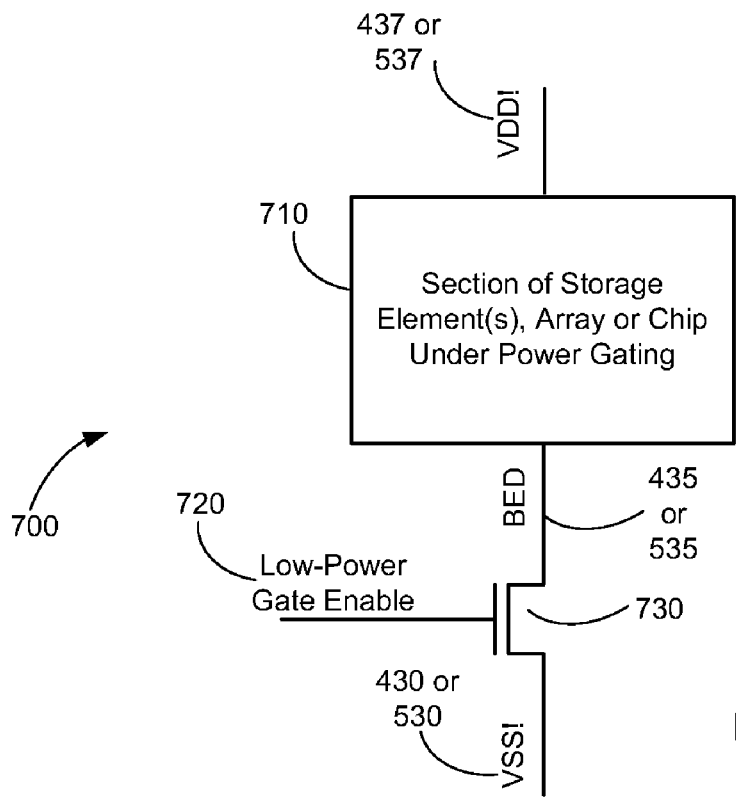
FIGS. 7A and 7B illustrate exemplary representations of power gating for a low power state (on the ground side and the power side respectively), according to one exemplary embodiment.
Figure 7B:
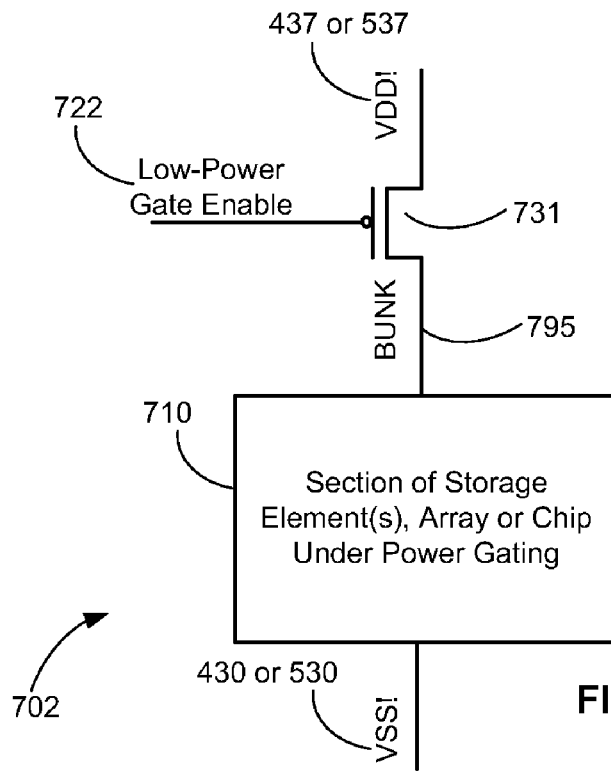

Turning now to FIGS. 7A and 7B, exemplary representations of power gating for a low power state (on the ground side and the power side respectively), according to one embodiment, are depicted. In one embodiment, power gating refers to switching power "on" and "off" in a storage element 310 or part of an electronic device using a gate or transistor or MOSFET or the like as a switch. In accordance with one embodiment, FIG. 7A shows a gating circuit 700 which may switch a connection from the actual ground node VSS! (430 or 530) to the false ground node BED (435 or 535). Gating circuit 700 includes, in one embodiment, an nFET 730 with drain connected to the false ground node BED (435 or 535) and source connected to the actual ground node VSS! (430 or 530). The nFET 730 may act like a switching or gating component. The gate of the nFET 730 may be connected to a low power gate enable signal 720 indicative of a change to, or from, a low power state. The low power gate enable signal 720 may be driven by a processor, controller, combinatorial control circuit or the like. The low power gate enable signal 720 may be indicative of a user's desire to place the storage element 310 and/or electronic device in low power state, or alternatively, may be indicative of a condition in which the storage element 310 and/or electronic device should be placed into low power state (e.g., a time out and/or period of inactivity or other condition indicative of a need for power conservation). In FIG. 7A, the low power gate enable signal 720 may be driven "high" to enable the nFET 730 and driven "low" (i.e., not driven "high") to disable the nFET 730. When enabled, the nFET 730 allows a connection from the power node VDD! (437 or 537) to the actual ground node VSS! (430 or 530), and thus allows a storage element 310 (or an array 320 or a silicon chip 340) to operate in a non-low power mode. If disabled, the nFET 730 breaks the connection from the power node VDD! (437 or 537) to the actual ground node VSS! (430 or 530), and makes a connection to the false ground node BED (435 or 535) instead of the actual ground node VSS! (430 or 530). When connected to the false ground node BED (435 or 535), a low power mode is entered and maintained.

In accordance with one embodiment, FIG. 7B shows a gating circuit 710 which may switch a connection from the power node VDD! (437 or 537) to a false power node BUNK 795. The gating circuit 710 includes, in one embodiment, a pFET 731 with drain connected to the false power node BUNK 795 and source connected to the power node VDD! (437 or 537). The pFET 731 may act like a switching or gating component. The gate of the pFET 731 may be connected to a low power gate enable signal 722 indicative of a change to, or from, a low power state. The low power gate enable signal 722 may be driven by a processor, controller, combinatorial control circuit or the like. The low power gate enable signal 722 may be indicative of a user's desire to place the storage element 310 and/or electronic device in low power state, or alternatively, may be indicative of a condition in which the storage element 310 and/or electronic device should be placed into low power state (e.g., a time out and/or period of inactivity or other condition indicative of a need for power conservation). In FIG. 7A, the low power gate enable signal 722 may be driven "low" (i.e., not driven "high") to enable the pFET 731 and driven "high" to disable the pFET 731. When enabled, the pFET 731 allows a connection from the power node VDD! (437 or 537) to the actual ground node VSS! (430 or 530), and thus allows a storage element 310 (or array 320 or silicon chip 340) to operate in a non-low power mode. If disabled, the pFET 731 breaks the connection from the power node VDD! (437 or 537) to the actual ground node VSS! (430 or 530), and makes a connection to the false power node BUNK 795 instead of to the power node VDD! (437 or 537). When connected to the false power node BUNK 795, a low power mode is entered and maintained.

With respect to FIGS. 7A and 7B, it is contemplated in various embodiments that sections of storage elements 310, sections of arrays 320 and/or sections of silicon chips 340 may operate under power gating. That is, an entire storage element 310, an array 320 and/or a silicon chip 340 may be power gated, or only a section of a storage element 310, an array 320 and/or a silicon chip 340 may be power gated, in accordance with one or more embodiments. It should be noted that when power gating is utilized and a storage element 310 is not connected to a power node or an actual ground node (i.e., the storage element 310 is connected only to the false power node BUNK 795 or the false ground node BED (435 or 535)), such a connection may be referred to as a connection to a floating power node or a floating ground node respectively.

Figure 8:
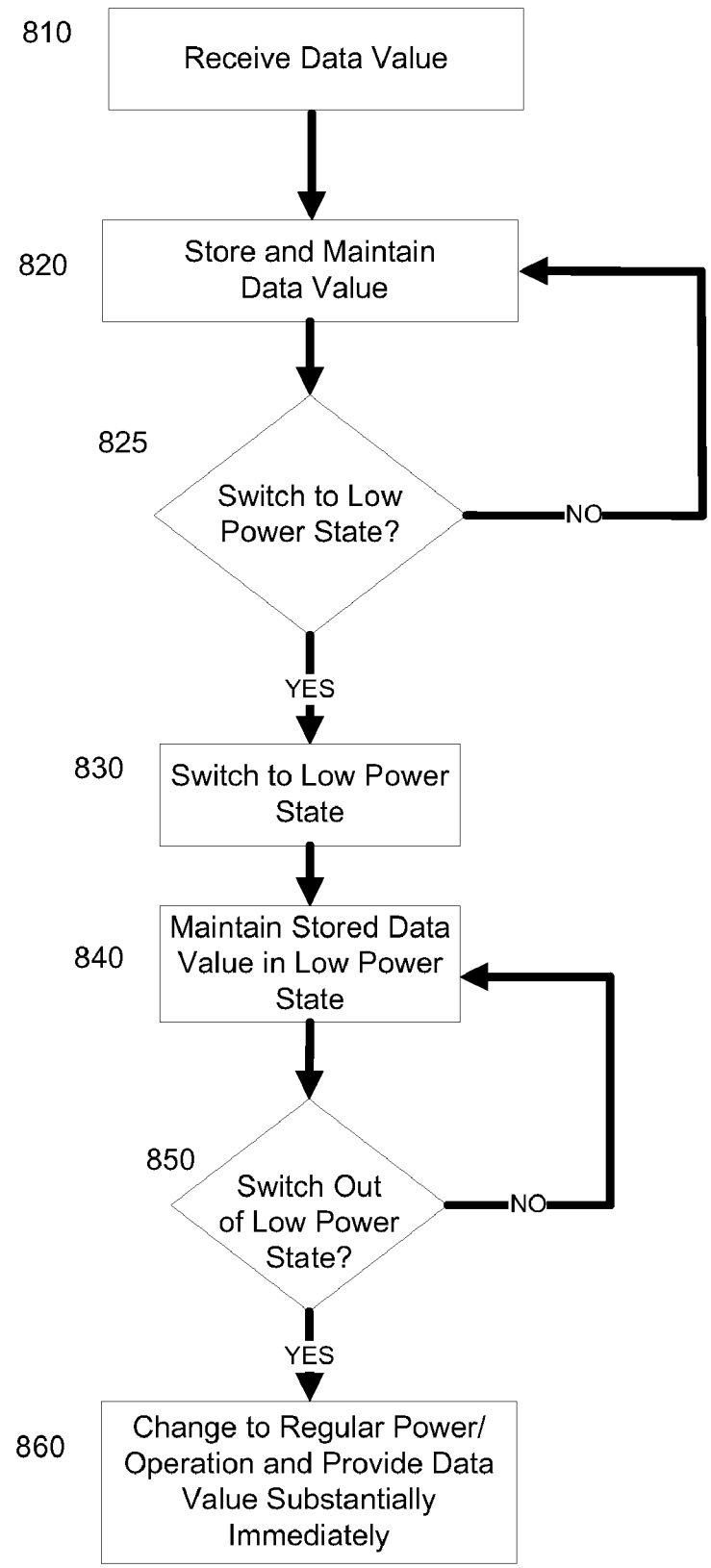
FIG. 8 illustrates a low power state, data storage operation flowchart according to one exemplary embodiment.

Turning now to FIG. 8, a low power state, data storage operation flowchart according to one embodiment of the present invention, is depicted. At step 810, a storage element 310 may receive a data value. Typically, the data value is received at an input (e.g., the input terminal 550), but more than one input may be implemented in various storage elements 310. Once a data value is received by storage element 310, the data value may be stored at step 820. The data value may be stored at the storage node 540 (storage component 540), and an inverted value may be stored at the storage node 545 (storage component 545). At step 825, it is determined whether or not the storage element 310 will be switched to a low power state/mode. The storage element 310 may be switched to a low power state/mode using power gating (described above in FIGS. 7A and 7B, and accompanying description) or the like. If it is determined at step 825 that the storage element 310 will not be placed in a low power state/mode, the storage element 310 continues to operate in a regularly powered mode and maintains the stored data value at the storage node 540 (storage component 540) (step 820). If, however, it is determined that the storage element 310 will be placed in a low power state/mode, the flow continues to step 830.

At step 830, the storage element 310 is placed into a low power state/mode. When the storage element 310 is in a low power state/mode, the storage element 310 is able to maintain the stored data value while in a low power state/mode (step 840). While in the low power state/mode, it is determined at step 850 whether or not the storage element 310 will switch out of the low power state/mode. If it is determined that the storage element 310 will not switch out of the low power state/mode (i.e., the storage element 310 will not return to a regularly powered and operational mode), the flow returns to step 840 where the stored data value is maintained in a low power state/mode. If it is determined at step 850 that the storage element 310 is to be switched from the low power mode/state to a regularly powered operational state/mode, the flow proceeds to step 860 where the storage element 310 is placed in a regular power and operation state/mode. Also at step 860, the storage element 310 provides the maintained stored data value to an output of the storage element 310 substantially immediately after changing out of the low power state/mode. In one embodiment, the maintained stored value is provided on the inverted output terminal 555 (as shown in FIG. 5), although in various embodiments other output configurations may be used.

Turning now to FIG. 9, an exemplary, detailed low power state, data storage operation flowchart with respect to the switch to a low power state (as shown in FIG. 8), according to one embodiment, is depicted. In one or more embodiments, step 830 of FIG. 8 may include a step 910 in which the connection of the pair of cross-coupled inverter components 600 to the actual ground node VSS! 530 is maintained (described above with respect to FIG. 5). By maintaining this connection, the pair of cross-coupled inverter components 600 do not lose power and are thus able to maintain the stored data value. Step 830 of FIG. 8 may also include a step 920. In one embodiment, at step 920, the storage element 310 is placed in a low power state/mode by disconnecting the other components 599 from the actual ground node VSS! 530 (step 920) and connecting the other components 599 (described above with respect to FIG. 5) to false ground node BED 535 (step 930), while maintaining power to the pair of cross-coupled inverter components 600 (i.e., maintaining their connection to the actual ground node VSS! 530). Once in a low power state/mode, the storage element 310 may maintain the stored data value while in the low power state/mode (at step 840).

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate Graphic Database System (GDS) data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., the data storage unit(s) 160, the RAMs 130 & 155, compact discs, DVDs, solid state storage and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into a computer 100, processor 125/140 or controller, which may then control, in whole or part, the operation of a semiconductor manufacturing facility (or fab) 390 to create semiconductor products and devices. For example, in one embodiment, silicon wafers 330 containing various configurations of power gateable retention storage elements 310 may be created using the GDSII data (or other similar data).

It should also be noted that while various embodiments may be described in terms of power gateable retention storage elements, it is contemplated that the embodiments described herein may have a wide range of applicability, not just for specific implementations described here, as would be apparent to one of skill in the art having the benefit of this disclosure.

The particular embodiments disclosed above are illustrative only, as the invention may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope and spirit of the claimed invention.

Accordingly, the protection sought herein is as set forth in the claims below.

What is claimed:

1. A method comprising:
    storing a data value in a storage element, wherein the storage element is at least one of a flip-flop, a latch or a register;
    placing the storage element in a low power state comprising removing one or more existing connections between the actual ground node and at least one other component in the storage element; and
    maintaining the data value in the storage element subsequent to placing the storage element into the low power state.

2. The method of claim 1, wherein maintaining the data value further comprises:
    maintaining the data value stored by the storage element using a pair of cross-coupled inverter components, wherein each inverter component drives the other inverter component.

3. The method of claim 2, wherein placing the storage element in a low power state, further comprises maintaining a connection between the pair of cross-coupled inverter components and an actual ground node.

4. The method of claim 3 further comprising:
    connecting the at least one other component in the storage element to a false ground node in response to removing the one or more existing connections between the actual ground node and at least one other component in the storage element.

5. The method of claim 4, further comprising:
    locating one or more connection contacts of at least one of the cross-coupled inverter components at a pre-determined distance from the false ground node connection, wherein the pre-determined distance is greater than the connection distance to an actual ground node connection.

6. The method of claim 2, wherein placing the storage element in a low power state, further comprises:
    maintaining a connection between the pair of cross-coupled inverter components and a non-ground potential node; and
    removing one or more existing connections between the non-ground potential node and at least one other component in the storage element.

7. The method of claim 1, further comprising:
    providing an output of the storage element substantially immediately after returning the storage element from a low power state to an operating state.

8. The method of claim 1, further comprising:
    receiving a signal indicative of a change to a low power state; and
    wherein placing the storage element in a low power state further comprises entering the low power state substantially immediately after receiving the signal indicative of a change to a low power state.

9. The method of claim 1, wherein the storage element is sized to fit a standard storage element footprint.

10. An electronic device, comprising:
    a storage component for storing a data value; and
    a pair of cross-coupled inverter components communicatively coupled to the storage component, the pair of cross-coupled inverter components being adapted to maintain the data value stored by the storage component subsequent to placing the storage component into a low power state and being adapted to maintain a connection with an actual ground node subsequent to placing the storage component into the low power state.

11. The electronic device of claim 10, wherein the pair of cross-coupled inverter components are further adapted to maintain the data value by using each inverter component of the cross-coupled inverter components to drive the other inverter component.

12. The electronic device of claim 10, further comprising:
    a false ground node;
    an output node communicatively coupled to at least the storage component; and at least one additional electronic device component selectively coupled to at least one of the false ground node and the actual ground node.

13. The electronic device of claim 12, further comprising:
a switching component communicatively coupled the false ground node and the actual ground node, wherein the switching component is adapted to receive a signal indicative of a change to a low power state, and adapted to place the storage element in a low power state substantially immediately after receiving the signal indicative of a change to a low power state.

14. The electronic device of claim 13, wherein the switching component is further adapted to perform at least one of removing one or more existing connections between the actual ground node and at least one other component in the storage element, or connecting the at least one additional electronic device component to the false ground node.

15. The electronic device of claim 12, wherein the cross-coupled inverter components further comprise:
one or more actual ground connection contacts, wherein the one or more actual ground connection contacts are located at a pre-determined distance from the false ground node connection, wherein the pre-determined distance is greater than the connection distance to an actual ground node connection.

16. The electronic device of claim 11, wherein the electronic device is adapted to:
maintain a connection between the pair of cross-coupled inverter components and a non-ground potential node; and
remove one or more existing connections between the non-ground potential node and at least one additional electronic device component.

17. The electronic device of claim 11, wherein the output node is further adapted to:
provide an output of the storage component substantially immediately after returning the storage element from a low power state to an operating state.

18. A computer readable storage device encoded with data that, when implemented in a manufacturing facility, adapts the manufacturing facility to create an apparatus, comprising:
a silicon chip, comprising
at least one storage element, comprising:
a storage component adapted to store a data value; and
a pair of cross-coupled inverter components communicatively coupled to the storage component, the pair of cross-coupled inverter components being adapted to maintain the data value stored by the storage component subsequent to placing the storage component into a low power state;
a false ground node communicatively coupled to the at least one storage element;
an actual ground node communicatively coupled to the at least one storage element; and
at least one switching component communicatively coupled the false ground node and the actual ground node, wherein the at least one switching component is adapted to receive a signal indicative of a change to a low power state, and adapted to place the at least one storage elements in a low power state substantially immediately after receiving the signal indicative of a change to a low power state.

19. A computer readable storage device, as set forth in claim 18, encoded with data that, when implemented in a manufacturing facility, adapts the manufacturing facility to create an apparatus, wherein the at least one storage element further comprises:
an output node communicatively coupled to at least the storage component;
at least one additional electronic device component selectively coupled to at least one of the false ground node and the actual ground node; and
wherein the at least one switching component is further adapted to perform at least one of removing one or more existing connections between the actual ground node and at least one other component in the storage element, or connecting the at least one additional electronic device component to the false ground node.

20. A computer readable storage device, as set forth in claim 18, encoded with data that, when implemented in a manufacturing facility, adapts the manufacturing facility to create an apparatus, wherein placing the storage element in a low power state, further comprises:
maintaining a connection between the pair of cross-coupled inverter components and an actual ground node.

21. A computer readable storage device, as set forth in claim 18, encoded with data that, when implemented in a manufacturing facility, adapts the manufacturing facility to create an apparatus, wherein the at least one storage element further comprises:
one or more actual ground connection contacts, wherein the one or more actual ground connection contacts are located at a pre-determined distance from the false ground node connection, wherein the pre-determined distance is greater than the connection distance to an actual ground node connection.

22. A computer readable storage device, as set forth in claim 18, encoded with data that, when implemented in a manufacturing facility, adapts the manufacturing facility to create an apparatus, wherein placing the storage element in a low power state, further comprises:
maintaining a connection between the pair of cross-coupled inverter components and a non-ground potential node; and
removing one or more existing connections between the non-ground potential node and at least one other component in the storage element.

23. A computer readable storage device, as set forth in claim 18, encoded with data that, when implemented in a manufacturing facility, adapts the manufacturing facility to create an apparatus, the storage element being further adapted to perform at least one of:
providing an output of the storage element substantially immediately after returning the storage element from a low power state to an operating state; or
receiving a signal indicative of a change to a low power state, and wherein placing the storage element in a low power state further comprises entering the low power state substantially immediately after receiving the signal indicative of a change to a low power state.

24. A computer readable storage device, as set forth in claim 18, encoded with data that, when implemented in a manufacturing facility, adapts the manufacturing facility to create an apparatus, wherein each of the at least one storage elements is sized to fit a standard storage element footprint.

25. A system, comprising:
an array of storage elements, wherein each storage element of the array of storage elements is adapted to store a data value, each storage element comprising:
at least one storage components, each component of the plurality of storage components being adapted to store a data value; and
at least one pair of cross-coupled inverter components respectively communicatively coupled to the at least one storage component, the at least one pair of cross-coupled inverter components being adapted to maintain the data value stored by the at least one storage component subsequent to placing the array of storage elements into a low power state, wherein each inverter component of a pair of cross-coupled inverter components is adapted to drive the other inverter component; and at least one output node respectfully communicatively coupled to at least the at least one storage components;

a false ground node communicatively coupled to the array of storage elements; and an actual ground node communicatively coupled to the array of storage elements.

26. The system of claim 25, wherein each storage element further comprises:

at least one switching component communicatively coupled the false ground node and the actual ground node, wherein the at least one switching component is adapted to receive a signal indicative of a change to a low power state, and adapted to place the at least one storage elements in a low power state substantially immediately after receiving the signal indicative of a change to a low power state.

27. The system of claim 26, further comprising:

a processor communicatively coupled to the array of storage elements;

a memory communicatively coupled to the processor;

a user input device communicatively coupled to the processor; and a display unit communicatively coupled to at least one of the processor, the memory or the array of storage elements.

28. The system of claim 27, wherein the system is at least one of a desktop computer, a laptop computer, a server, a computing device, a computer display device, a printers, a scanner, a processing device, a wireless device, a personal digital assistant, a mobile phone, a portable music player, a video game, a video game console, an audio or video player, a stereo, a television, manufacturing equipment, an automobile, a motorcycle, a mass-transit vehicle, or a security system.

29. The system of claim 25, wherein each storage element of the array of storage elements is sized to fit a standard storage element footprint.

* * * * *